United States Patent [19]

Smyth, Jr.

[11] Patent Number: 4,914,601
[45] Date of Patent: Apr. 3, 1990

[54] METHOD FOR PROFILING WAFERS AND FOR LOCATING DIES THEREON

[75] Inventor: John B. Smyth, Jr., Corvallis, Oreg.

[73] Assignee: Hewlett-Packard Company, Palo Alto, Calif.

[21] Appl. No.: 160,231

[22] Filed: Feb. 25, 1988

[51] Int. Cl.4 .................. G06F 15/20; G01B 7/00
[52] U.S. Cl. ............................ 364/490; 364/194; 364/559; 364/560
[58] Field of Search .............. 364/468, 488–491, 364/559, 560, 550, 551.01, 194; 356/376; 250/560, 563, 571, 572; 324/158 P

[56] References Cited

U.S. PATENT DOCUMENTS

| 4,473,750 | 9/1984 | Oshida et al. | 250/560 |
| 4,707,610 | 11/1987 | Lindow et al. | 250/560 |
| 4,732,485 | 3/1988 | Morita et al. | 356/376 |
| 4,748,335 | 5/1988 | Lindow et al. | 356/376 X |
| 4,750,141 | 6/1988 | Judell et al. | 364/550 |

Primary Examiner—Joseph Ruggiero
Attorney, Agent, or Firm—S. A. Kassatly

[57] ABSTRACT

A new and improved method for profiling wafers, and for uniquely identifying the dies formed thereon, wherein the method includes the step of locating a set of reference points along the periphery of the wafer, relative to a predetermined coordinate system. Next, the equation of a hypothetical circle which substantially contours the periphery of the wafer, and which passes through the reference points, is defined. The coordinates of the center of the hypothetical circle, as well as the coordinates of an arbitrary reference die on the wafer, are then derived from the equation of the hypothetical circle. Subsequently, the entire surface of the wafer is mapped relative to the center or to the reference die, by utilizing predetermined stepping dimensions.

8 Claims, 2 Drawing Sheets

METHOD FOR PROFILING WAFERS AND FOR LOCATING DIES THEREON

BACKGROUND OF THE INVENTION

1. Field of the Invention

The present invention relates in general to the manufacturing and testing of integrated circuits, and it more particularly relates to a method for locating one or more individual integrated circuits, or dies, on a wafer containing a plurality of dies.

2. Background Information

Integrated circuits of the general type with which the present invention is concerned, are produced by passing a wafer through several consecutive manufacturing and testing stages. The wafer is typically substantially circular in shape, and is usually between two to six inches in diameter. The manufacturing stage includes a construction stage during which the integrated circuits, or dies are formed on the wafer, while the testing stage includes identifying and isolating the defective dies. A separation stage and a packaging stage yield the operative dies, in preparation for shipment and installation.

A wafer is typically capable of holding several hundreds of individual dies. Of these dies, only a relatively small percentage, often between ten percent (10%) to over fifty percent (50%) percent are operative, while the remaining dies are defective, and therefore unusable. The reasons for such a low yield usually relate to extremely high precision requirements of the manufacturing process, as well as the level of existing impurities.

While various attempts have been suggested to improve the yield of the testing process, none has proven to be entirely satisfactory. One such attempt is described in U.S. Pat. No. 4,607,525 to Turner et al., which relates to a height measuring device. The patented device is a profiling and testing system which utilizes an air probe to determine the contour of a wafer, in order to enable an electrical sensor to step from die to die, and to test the completed dies in the water.

The patented device utilizes a pressure transducer for determining the locations of the physical edge of the wafer. Lines are then traced between these edges for geometrically determining the center of the wafer, and defective dies are then located relative to the center. While the patented device may have been successful in simplifying the tracing of the wafer profile, it has not improved substantially the overall yield of the manufacturing process.

The relative inefficiency of the patented device can be exemplified by the use of edge sensors, for locating the reference edges or unique features or dies on the wafer. As it is well known in the art, an edge sensor may cause substantial damage to the sensitivity constructed dies on the wafer, such as by weakening, or even breaking the conductive rings which generally surround the electronic circuits of the dies. As a result, it is not uncommon for some dies to be tested as functional, and to become defective after packaging, or shortly after installation.

The replacement of circuit boards having such inherently defective, but apparently operative dies installed thereon, is relatively expensive, and particularly inefficient, for reasons that are obvious to those skilled in the art. Furthermore, an edge sensor can become defective, due to the recurring impact with the edges of the wafer, and it can require periodic replacement or maintenance. Such maintenance can cause the manufacturing process to be continuously hampered, interrupted and delayed.

Thus, there is a need for a new and improved method for profiling wafers, and for locating accurately and identifying uniquely the complete or unique dies manufactured thereon. The method should improve the yield of the conventional manufacture and testing of the micro-electronic circuits, and it should further dispense with the use of edge sensors for profiling the wafer, and with the requirement for unique reference points that do not substantially contribute to the improvement of the yield.

The electrical testing stage of the wafer is essential for the overall manufacturing process, since the testing must detect and identify the functional dies to be packaged, as well as the defective dies which should be discarded. In order for the conventional electrical testing to work properly, the connection points, or pads, of the dies must be aligned accurately with the probes of the tester. In this regard, even a relatively minute misalignment of the dies may cause the functional dies to be incorrectly identified as defective, and thus to be wastefully discarded.

Automatic wafer probers are typically used to move the dies underneath the probes of the testing in a very precise manner to minimize the risk of misalignment. After the testing stage is completed, the functional dies must be identified and separated from the defective dies, so that only the operative dies are subsequently packaged for shipment or installation.

Conventionally, the defective dies are visually identified by inking or scratching. The identification process may be done either "on-line" or "off-line". When the dies are identified "on-line", the defective dies are usually scratched or inked immediately after the test is completed. When the dies are identified "off-line", the defective dies are scratched or inked after all the dies have been tested as a separate process step.

Several problems are associated with the foregoing conventional identification process. For example, the scratching of the dies can cause them to become irreversibly altered. In some instances, the probes of the tester may be misaligned, the entire wafer may be incorrectly marked, and the dies may be inaccurately identified as defective. As a result, the entire wafer is rejected, and the manufacturing cost is substantially increased, and rendered prohibitively expensive.

While the alternative inking process is partially reversible, it is common for the ink to come in contact with the pads of adjacent operative dies, rendering them defective and unusable. Furthermore, the ink is generally at the base of epoxy, and cannot be easily removed, particularly after it has been exposed to relatively high temperatures. Therefore, it is preferable to wait until all the dies on the wafer have been tested, prior to commencing the marking process.

Thus, there is a need for a new and improved profiling process, which, in addition to enabling the accurate identification of the dies on the wafer, and in addition to improving the yield of the conventional manufacture of the microelectronic circuits, dispenses with the use of the foregoing harmful conventional visual marking techniques.

Conventionally, the "off-line" identification of the dies requires that a substantially exact alignment be maintained between the wafer on the wafer prober in the tester, and the wafer on the prober in the inker. A relatively minute misalignment can result in an incorrect marking of the dies, and can thus contribute to a substantial decrease in the production yield.

Therefore, there is a need for a new and improved process which increases the alignment tolerance of the manufacture process, and which accommodates physical shifts of the wafer.

Another concern associated with the conventional profiling methods, has been the exclusion of the dies within a peripheral zone by an automatic wafer stepper. Such zonal dies are generally undesirable, since they can be structurally incomplete, such as by missing a corner or a portion of a side. Thus, while the testing of such zonal dies may indicate their proper functionality, such dies need to be rejected, in order to prevent potential costly remedial steps after installation. An additional concern associated with the zonal or peripheral dies has been the damage caused to the probe card during the testing stage.

Therefore, it is highly desirable to have a new and improved method for profiling wafers, and for locating accurately and identifying uniquely the dies manufactured thereon. The method should improve the yield of the conventional manufacture of the micro-electronic circuits, and it should further dispense with the use of the edge sensors, for profiling the wafer, or for accurately locating dies thereon.

The new and improved profiling process, should dispense with the use of the conventional visual inking and scratching marking techniques, and it should exclude the peripheral dies, which are physically or electronically whole, without causing damage to the testing probe. The inventive method should further be compatible with automatic wafer probers from different manufacturers.

SUMMARY OF THE INVENTION

It is therefore one object of the present invention to provide a new and improved new and improved method for profiling wafers and accurately locating the dies thereon.

It is another object of the present invention to provide a new and improved profiling method for locating accurately, and for identifying uniquely, the dies manufactured on the wafer.

It is still another object of the present invention to provide a new and improved profiling method which dispenses with the use of the edge sensors, as well as allows for an accurate alternative identification technique to the conventional visual linking and scratching marking techniques.

It is a further object of the present invention to provide a new and improved profiling method which excludes the peripheral dies, whether caused by process or pattern shift, without causing damage to the testing probe.

It is yet another object of the present invention to provide a new and improved profiling and testing method which is compatible with automatic wafer probers from different manufacturers.

It is still a further object of the present invention to provide a new and improved profiling method, which does not utilize potentially functional "drop out" or reference dies.

Briefly, the above and further objects and features of the present invention are realized by providing a new and improved method for profiling wafers, and for uniquely identifying the dies formed thereon. The method includes the step of locating a set of reference points along the periphery of the wafer, relative to a predetermined coordinate system.

Next, the equation of a hypothetical circle which substantially contours the periphery of the wafer, and which passes through the reference points, is defined. The coordinates of the center of the hypothetical circle, as well as the coordinates of an arbitrary reference die on the wafer, are then derived from the equation of the hypothetical circle. Subsequently, the entire surface of the wafer is mapped relative to the center or to the reference die, by utilizing predetermined stepping dimensions.

Therefore, such unique profiling process of the wafer and of the dies thereon, renders the testing process amenable to automation, and increases the accuracy of the die identification, regardless of the orientation of the wafer on the tester or packager. The elimination, or substantial reduction of the use of the edge sensors minimizes the accidental damage to the dies, and hence improves the yield and efficiency of the manufacturing process.

The exclusion of the peripheral dies substantially reduces the damage to the probe card, and thus minimizes the inaccuracy in the identification of operative dies. Additionally, the elimination of the conventional visual marking techniques, and of the "drop out" reference dies, further contributes to the improvement of the yield and efficiency of the integrated circuit manufacturing process.

BRIEF DESCRIPTION OF THE DRAWINGS

The above-mentioned and other objects and features of the present invention, and the manner of attaining them, will become apparent, and the invention itself will be best understood by reference to the following description of the embodiment of the invention taken in conjunction with the accompanying drawings, wherein.

DESCRIPTION OF THE PREFERRED EMBODIMENT

Figure 1:
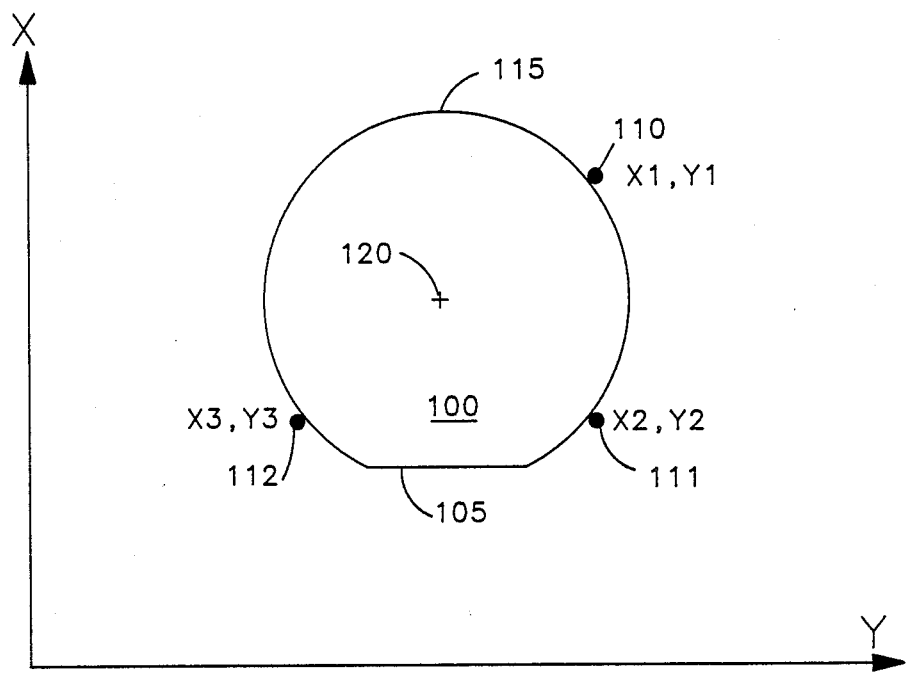
FIG. 1 is a diagrammatic top plan view of a wafer which is being profiled and tested in accordance with the method of the present invention.
Figure 2:
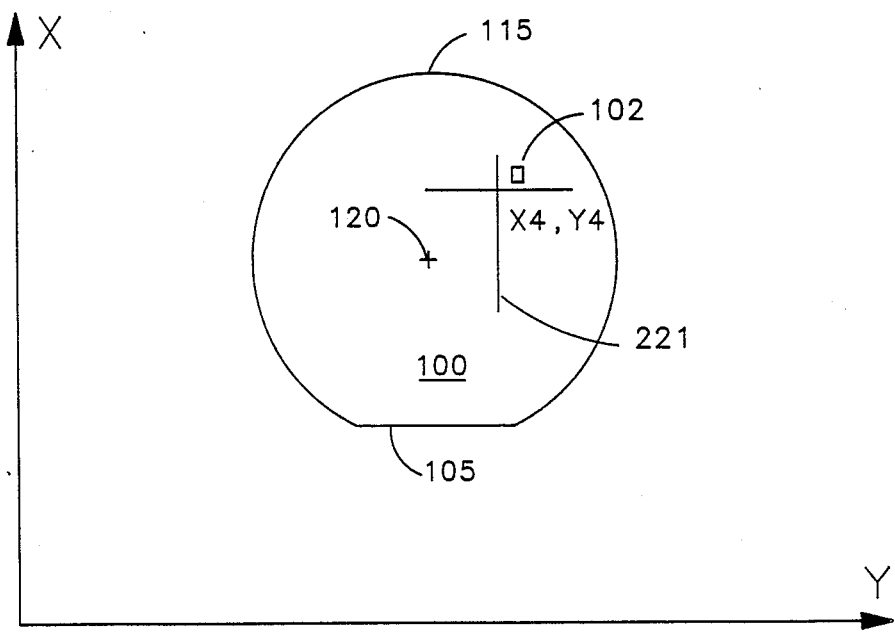
FIG. 2 is a diagrammatic top plan view of the wafer of FIG. 1 with a reference die located thereon.

FIGS. 1 and 2 of the drawings illustrate a wafer 100 which is being profiled in accordance with the process of the present invention. The wafer 100 is typically circular in shape, and has one or more flats of different sizes. The largest flat 105 is known as the major flat, while the remaining relatively smaller flats (not shown) are known as the minor flats. The disposition of the minor flats relative to the major flat 105, serves to identify the composition of the wafer 100.

Figure 3:
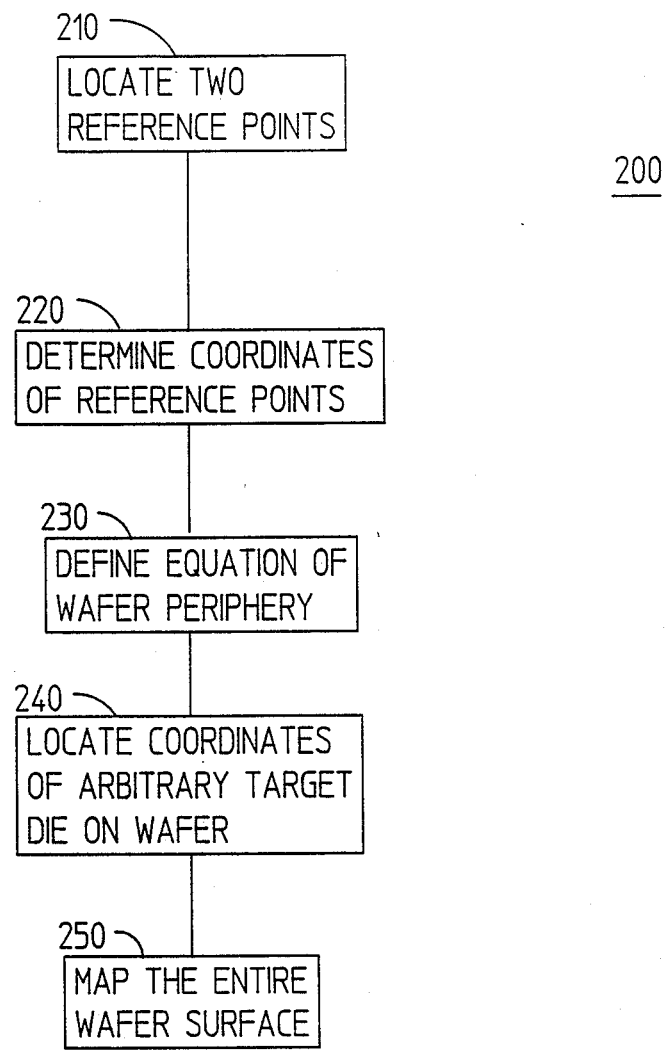
FIG. 3 is a flow chart of a method for profiling wafers and for locating dies thereon, in accordance with the present invention.

FIG. 3, illustrated a method 200 for profiling wafers and for locating dies thereon, in accordance with the present invention. The first step 210 in the present inventive method is to locate an arbitrary step of peripheral reference points, such as the points 110, 111 and 112, having the coordinates $(X1,Y1)$, $(X2,Y2)$, and $(X3,Y3)$ respectively, relative to a predetermined coordinate system $(X,Y)$. While in the preferred embodiment of the present invention, these reference points are located along the outer peripheral edge 115 of the wafer 100, it will become apparent to those skilled in the art, after reviewing the description herein, that such reference points can be taken at different locations relative to the coordinate system. It should be noted however, that for the purpose of simplification, the references points are not taken along the major or minor flats of the wafer.

After determining the coordinates (X1,Y1), (X2,Y2) and (X3,Y3) of the reference points 110, 111 and 112 respectively at 220, the next step 230 in the present process is to define the equation of a hypothetical circle contouring the peripheral edge 115, and passing through the reference points 110, 111 and 112. It should be understood that if the outer radius of the wafer 110 and the center point of the chuck (not shown) that moves the wafer 110 were known, only two reference points would be needed to determine the equation of the peripheral edges 115. Thus, the coordinates of the third reference point are generally needed when the radius of the wafer 100 is not given, or in order to increase the accuracy of the measurements.

The following equation (1) represents the equation of the aforementioned hypothetical circle:

$$(X-a)^2 + (Y-b)^2 - r^2 = 0 \quad (1)$$

Where (a,b) and r respectively represent the coordinates of the center 120 and the radius of the circle passing through the peripheral edge 115.

Once the equation of the peripheral edge 115 is determined, the coordinates a and b of the center 120 are derived relative to the coordinate system. Sometimes, when the value of the radius r is not known, it can be derived from equation (1), by simply substituting the coordinates (X1, Y1), (X2,Y2) and (X3,Y3) of the references points 110, 111 and 112 therein. By solving equation (1), the values of a, b and r are found to be as follows:

$$a = \frac{x(2)^2 - x(1)^2 + y(2)^2 - y(1)^2 + 2by(1) - 2by(2)}{2x(2) - 2x(1)} \quad (2)$$

$$b = \frac{\frac{x(3)^2 - x(1)^2 + y(3)^2 - Y(1)^2}{x(3) - x(1)} - \frac{x(2)^2 - x(1)^2 + y(2)^2 - y(1)^2}{x(2) - x(1)}}{\frac{2y(1) - 2y(2)}{x(2) - x(1)} - \frac{2y(1) - 2y(3)}{x(3) - x(1)}} \quad (3)$$

$$r = [(x(1) - a)^2 + (y(1) - b)^2]^{1/2} \quad (4)$$

Once the coordinates (a,b) of the center 120 are defined, the coordinates (X4,Y4) of an arbitrary target die 102, which is conveniently located on the wafer 100, are then determined relative to the coordinate system at 240. Using predetermined stepping dimensions, the wafer 100 is then entirely mapped at 250. As a result, the coordinates of any die on the wafer 100, can be established with a high degree of accuracy, regardless of the repositioning orientation and shift of the wafer 100, relative to the coordinate system, or the shift of the die pattern on the wafer 100.

Therefore, the present profiling process enables the wafer 100, as well as other wafers to be uniquely mapped. Consequently, each die on the wafer can be identified accurately, without the use of conventional edge sensors, as visual marking techniques. Furthermore, the peripheral dies can be excluded with minimal or no damage to the testing probe. The inventive method is almost universally compatible with automatic wafer probers from different manufacturers, and it does not unnecessarily sacrifice potentially operative "drop out" dies.

A computer (not shown) can be used to perform the necessary calculations, and to control the profiling process. The following software program can be employed by the computer to implement the inventive profiling process:

```
1010 !
1020 !       WHOLE DIE LOCATOR    VERSION 2.16.87  Rev B.
1030 !
1040 ! This program finds the center and diameter of a wafer from X and Y values
1050 ! found by the autoprober.  It then calculates an absolute wafer map
1060 ! for the particular wafer on the chuck table. The map is calculated
1070 ! relative to the center which was found earlier and any target die/street
1080 ! location.
1090 !
1100 PWIDTH INF @ WIDTH INF
1110 !
1120 ! ROUTINE TO FIND THE X and Y OFFSETS    ********
1130 ! ENTER THE X,Y VALUES AS OBTAINED FROM THE AUTOPROBER
1140 !
1150 INPUT "FIRST PAIR (microns): ";X1,Y1
1160 INPUT "SECOND PAIR: ";X2,Y2
1170 INPUT "THIRD PAIR: ";X3,Y3
1180 !
1190 K$=''
1200 INPUT 'SOLVE FOR WAFER DIAMETER? ','Y'; K$ @ IF K$='Y' THEN 1290 ELSE 1240
1210 !
1220 ! ENTER THE WAFER SIZE    ********
1230 !
```

```
1240 INPUT 'ENTER WAFER SIZE in mm: ','100';R
1250 ! IF R<>76 OR R<>100 THEN 1140
1260 IF R=76 THEN R=76000/2 !  CONVERT TO MICRONS
1270 IF R=100 THEN R=100000/2 !  CONVERT TO MICRONS
1280 !
1290 ! SOLVES FOR a and b OFFSETS          *********
1300 !
1310 N1=(X3^2-X1^2+Y3^2-Y1^2)/(X3-X1)
1320 N2=(X2^2-X1^2+Y2^2-Y1^2)/(X2-X1)
1330 N3=2*(Y1-Y2)/(X2-X1)
1340 N4=2*(Y1-Y3)/(X3-X1)
1350 N5=N3-N4
1360 N6=N1-N2
1370 B=N6/N5
1380 A=.5*(N2+B*N3)
1390 !
1400 ! ROUTINE TO ROUND OFF             **************
1410 !
1420 A1=IP(A*100) @ IF FP(A*100)>.49 THEN A1=A1+1
1430 A=A1/100
1440 B1=IP(B*100) @ IF FP(B*100)>.49 THEN B1=B1+1
1450 B=B1/100
1460 !
1470 IF K$<>'Y' THEN 1490 ! SOLVE FOR R (DIAMETER) IF NEEDED
1480 R=((X1-A)^2+(Y1-B)^2)^.5
1490 DISP USING 2900 ; A;" ";B;" ";R
1500 !
1510 ! CALCULATES MIN (?8) & MAX (?9) X and Y BASED ON CENTER   *************
1520 !
1530 X9,Y9=R @ X8,Y8=-R
1540 !
1550 ! ADJUSTMENT FOR WAFER FLAT  & LASER SCRIBE
1560 !
1570 INPUT "Major flat @ Ft,Bk,Lt,Rt :",'F';F$
1580 IF F$='F' THEN K8=Y8+3500 @ K9=Y9-4250
1590 IF F$='B' THEN K8=Y8+4250 @ K9=Y9-3500
1600 IF F$='L' THEN K8=X8+3500 @ K9=X9-4250
1610 IF F$='R' THEN K8=X8+4250 @ K9=X9-3500
1620 !
1630 ! ADJUSTMENT FOR MINOR FLAT (X7)        **************
1640 !
1650 INPUT "Minor flat @ Ft,Bk,Lt,Rt :",'L';F1$
1660 !
1670 IF F1$='L' THEN L8=X8+1420
1680 IF F1$='R' THEN L9=X9-1420
1690 IF F1$='F' THEN L8=Y8+1420
1700 IF F1$='B' THEN L9=Y9-1420
1710 !
1720 INPUT "Adjstmt for ERIM :",'0';E
1730 !
1740 ! STEPPING SIZE INPUT - ** FLAT TO FRONT **   ************
1750 ! This will come from the set-up dump into the prober    ***********
1760 !
1770 INPUT "STEP SIZE IN MICRONS (X,Y): ";X7,Y7
1780 !
1790 ! FROM AUTOPROBER * TARGET DIE LOCATION (AFTER ALIGN) *   **************
1800 !
1810 INPUT "TARGET CENTER COORD (X,Y): ";X6,Y6
1820 Z1=(X6-A)^2+(Y6-B)^2
1830 IF Z1>R^2 THEN 1840 ELSE 1850
1840 DISP "TARGET OFF WAFER - TRY AGAIN" @ GOTO 1810
1850 INPUT 'TARGET/STREET CENTER OFFSET :';X0,Y0 ! ASSUME BOTTOM RT CORNER
1860 !
1870 X6=X6-X0 @ Y6=Y6-Y0
```

```
1880 !
1890 ! REFERENCED TO CENTER OF WAFER    ***************
1900 !
1910 X6=X6-A @ Y6=Y6-B
1920 !
1930 ! CALCULATES ROW   *************
1940 !
1950 ! R1 & C1 are row and column as computed by
1960 ! the computer using the edge of the physical wafer.  R2 & C2 are
1970 ! the row and column as seen taking into account the zone
1980 ! blockouts due to flats and laser scribe.
1990 !
2000 R1=ABS(IP((Y9-Y6)/Y7)) @ R2=R1
2010 IF Fs='F' OR Fs='B' THEN R2=ABS(IP((K9-Y6)/Y7)) @ GOTO 2060
2020 IF F1s='B' THEN R2=ABS(IP((L9-Y6)/Y7))
2030 !
2040 ! CALCULATES COLUMN  **************
2050 !
2060 C1=ABS(IP((X6-X8)/X7)) @ C2=C1
2070 IF Fs='L' OR Fs='R' THEN C2=ABS(IP((X6-K8)/X7)) @ GOTO 2120
2080 IF F1s='L' THEN C2=ABS(IP((X6-L8)/X7))
2090 !
2100 ! ALIGNED TARGET DIE LOCATION ***** WHOLE DIE LOCATION *****
2110 !
2120 DISP "TARGET @ ROW ";R2;"   COLUMN ";C2
2130 !
2140 ! CALCULATE Y OF TOP MOST WHOLE DIE   ******
2150 !
2160 Y9=Y6+R1*Y7
2170 !
2180 !
2190 ! CALCULATE X OF LEFT MOST WHOLE DIE   *****
2200 !
2210 X8=X6-C1*X7
2220 !
2230 ! Draws map on printer for demo        *********
2240 !
2250 PRINT "    WHOLE DIE LOCATOR    Version 2.16.87  Rev B  ";DATES
2260 PRINT @ PRINT "X1= ";X1;"   Y1=";Y1
2270 PRINT @ PRINT "X2= ";X2;"   Y2=";Y2
2280 PRINT @ PRINT "X3= ";X3;"   Y3=";Y3
2290 R0=R*2 @ R0=R0/1000 @ PRINT @ PRINT R0;" MM WAFER" @ PRINT
2300 PRINT "A= ";A;"  B= ";B
2310 PRINT @ PRINT "STEP SIZE: X= ";X7;"  Y= ";Y7
2320 PRINT @ PRINT "ALIGNMENT DIE AT X= ";X6+A;"  Y= ";Y6+B;"  ROW:";R2;"  COLUM
2330 PRINT 'Major Flat at ';FS;'  Minor Flat at ';F1S
2340 IF E<>0 THEN PRINT 'ERIM of ';E;' used'
2350 PRINT @ PRINT @ PRINT "WHOLE DIE LOCATIONS (W)" @ PRINT @ PRINT
2360 !
2370 ! CALCULATE IF DIE POSITION HAS WHOLE DIE IN IT     ***********
2380 ! CALCULATED WRT TO CENTER POINT OF WAFER    ****
2390 ! X's AND Y's do NOT have a and b in them     *****
2400 !
2410 DIM D1S[200]
2420 FOR Y=Y9+Y7 TO Y8-Y7 STEP -Y7 ! START W/TOP ROW TO BOTTOM + 1
2430 D1S="" ! CLEAR PRINT STRING
2440 FOR X=X8-X7 TO X9+X7 STEP X7 ! START W/LEFT COLUMN TO RIGHT +1
2450 Ds=" " ! SET DIE TO NOT WHOLE
2460 IF X=X8-X7 THEN Ds="0"
2470 IF X=X9+X7 THEN Ds="0"
2480 IF Y=Y8-Y7 THEN Ds="0"
2490 IF Y=Y9+Y7 THEN Ds="0"
2500 C=X^2+Y^2
2510 IF C>(R-E)^2 THEN 2770
```

```
2520 C0=(X-X7)^2+(Y+Y7)^2
2530 IF C0>(R-E)^2 THEN 2770
2540 C2=(X-X7)^2+Y^2
2550 IF C2>(R-E)^2 THEN 2770
2560 C3=X^2+(Y+Y7)^2
2570 IF C3>(R-E)^2 THEN 2770
2580 !
2590 !  ALL 4 CORNERS ARE ON WAFER  **
2600 !
2610 DS="W" ! SET DIE TO WHOLE  **
2620 !
2630 IF X=X6 AND Y=Y6 THEN DS="T" ! DESIGNATE TARGET **
2640 !
2650 ! ZONAL BLOCKOUTS  *****
2660 !
2670 IF FS='F' OR FS='B' THEN 2680 ELSE 2700
2680 IF Y9>Y AND Y+Y7>K9 THEN DS=" "
2690 IF Y8<Y AND Y<K8 THEN DS=" "
2700 IF FS='L' OR FS='R' THEN 2710 ELSE 2730
2710 IF X9>X AND X>K9 THEN DS=" "
2720 IF X8<X AND X-X7<K8 THEN DS=" "
2730 IF F1S='R' THEN 2740 ELSE 2750
2740 IF X9>X AND X>L9 THEN DS=" "
2750 IF F1S='L' THEN 2760 ELSE 2770
2760 IF X8<X AND X-X7<L8 THEN DS=" "
2770 IF F1S='B' THEN 2780 ELSE 2790
2780 IF Y9>Y AND Y+Y7>L9 THEN DS=" "
2790 IF F1S='F' THEN 2800 ELSE 2820
2800 IF Y8<Y AND Y<L8 THEN DS=" "
2810 !
2820 D1S=D1S&" "&DS
2830 NEXT X
2840 PRINT D1S ! PRINTS ROW
2850 NEXT Y
2860 !
2870 !  WAFER MAP PRINTED
2880 !
2890 PRINT CHR$(12);
2900 IMAGE dddcddd.dd,2a
2910 END
```

While a particular embodiment of the present invention has been disclosed, it is to be understood that various different modifications are possible and are contemplated within the true spirit and scope of the appended claims. There is not intention therefore, of limitations to the exact abstract or disclosure herein presented.

What is claimed is:

1. A method for profiling the surface of a wafer having a plurality of dies formed thereon, comprising the steps of:
    (a) locating a set of at least two reference points along the periphery of the wafer, relative to a predetermined coordinate system;
    (b) determining the coordinates of said reference points;
    (c) defining the equation of the periphery of the wafer passing through the coordinates of said reference points;
    (d) locating the coordinates of an arbitrary target die on the wafer, relative to said equation of the wafer; and
    (e) mapping the entire wafer surface with a die grid based on the physical placement and dimensions of the wafer, by utilizing predetermined stepping dimensions.

2. The method as defined in claim 1, wherein the wafer has a substantially circular periphery, and wherein said step of defining the equation of the periphery includes the step of defining the equation of a hypothetical circle which substantially contours the periphery of the wafer.

3. The method as defined in claim 2, wherein said step of locating includes the step of determining the coordinates of two reference peripheral points.

4. The method as defined in claim 3, further including the step of determining the coordinates of the center of the substantially circular periphery of the wafer.

5. The method as defined in claim 4, wherein the step of computing the coordinates of the target die includes the step of utilizing the predetermined stepping dimensions.

6. The method as defined in claim 5, further including the step of determining the coordinates of a third peripheral point for computing the radius of the wafer.

7. The method as defined in claim 4, further including the step of excluding preselected peripheral dies.

8. The method as defined in claim 5, wherein the wafer includes at least one major flat, and wherein said peripheral reference points are not located on said major flat.

* * * * *